(12) United States Patent
Schulz et al.

(10) Patent No.: US 7,619,541 B2
(45) Date of Patent: Nov. 17, 2009

(54) REMOTE SENSOR PROCESSING SYSTEM AND METHOD

(75) Inventors: Kenneth R. Schulz, Manassas, VA (US); Andrew Hamm, Herndon, VA (US); John Rapp, Manassas, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 364 days.

(21) Appl. No.: 11/243,528

(22) Filed: Oct. 3, 2005

(65) Prior Publication Data
US 2006/0087450 A1  Apr. 27, 2006

Related U.S. Application Data

(60) Provisional application No. 60/615,192, filed on Oct. 1, 2004, provisional application No. 60/615,157, filed on Oct. 1, 2004, provisional application No. 60/615,170, filed on Oct. 1, 2004, provisional application No. 60/615,158, filed on Oct. 1, 2004, provisional application No. 60/615,193, filed on Oct. 1, 2004, provisional application No. 60/615,050, filed on Oct. 1, 2004.

(51) Int. Cl.
*G01V 3/00* (2006.01)
(52) U.S. Cl. .............................. 340/855.1; 340/870.07; 365/189.05; 712/2
(58) Field of Classification Search ............. 340/855.1, 340/870.07; 365/189.05; 712/2
See application file for complete search history.

(56) References Cited
U.S. PATENT DOCUMENTS

| | | | |
|---|---|---|---|
| 3,665,173 A | 5/1972 | Bouricius et al. | |
| 4,703,475 A | 10/1987 | Dretzka et al. | |
| 4,774,574 A * | 9/1988 | Daly et al. | 348/406.1 |
| 4,862,407 A | 8/1989 | Fette et al. | |
| 4,873,626 A | 10/1989 | Gifford | |
| 4,956,771 A | 9/1990 | Neustaedter | |

(Continued)

FOREIGN PATENT DOCUMENTS

EP   0694847   1/1996

(Continued)

OTHER PUBLICATIONS

Bakshi S; Gajski D D; "Partitioning and Pipelining for Performance-Constrained Hardware/Software Systems", IEEE Transactions on Very Large Scale Integration (VLSI) Systems, vol. 7, NR. 4, p. 419-432, (1999-12-00), XP000869229.

(Continued)

*Primary Examiner*—Timothy Edwards, Jr.
(74) *Attorney, Agent, or Firm*—Kevin D. Jablonski; Graybeal Jackson LLP

(57) ABSTRACT

A sensor assembly includes a sensor operable to sense a physical parameter and generate an electrical signal responsive to the sensed physical parameter. Local processing circuitry is physically positioned proximate the sensor and is electrically coupled to the sensor. The local processing circuitry includes an output port adapted to be coupled to a communications channel and the local processing circuitry is operable to process data from the sensor to generate processed sensor data and to provide the processed data on the output port.

25 Claims, 7 Drawing Sheets

U.S. PATENT DOCUMENTS

| | | | |
|---|---|---|---|
| 4,985,832 A | | 1/1991 | Grondalski |
| 5,159,449 A * | | 10/1992 | Allmendinger .......... 348/390.1 |
| 5,185,871 A | | 2/1993 | Frey et al. |
| 5,283,883 A | | 2/1994 | Mishler |
| 5,317,752 A | | 5/1994 | Jewett et al. |
| 5,377,333 A | | 12/1994 | Nakagoshi et al. |
| 5,383,187 A * | | 1/1995 | Vardakas et al. ............. 370/312 |
| 5,490,088 A * | | 2/1996 | Landis et al. ................ 709/237 |
| 5,544,067 A | | 8/1996 | Rostoker et al. |
| 5,583,964 A | | 12/1996 | Wang |
| 5,623,418 A | | 4/1997 | Rostoker et al. |
| 5,640,107 A | | 6/1997 | Kruse |
| 5,655,069 A | | 8/1997 | Ogawara et al. |
| 5,712,922 A | | 1/1998 | Loewenthal et al. |
| 5,752,071 A | | 5/1998 | Tubbs et al. |
| 5,784,636 A | | 7/1998 | Rupp |
| 5,801,958 A | | 9/1998 | Dangelo et al. |
| 5,867,399 A | | 2/1999 | Rostoker et al. |
| 5,892,962 A | | 4/1999 | Cloutier |
| 5,909,565 A | | 6/1999 | Morikawa et al. |
| 5,910,897 A | | 6/1999 | Dangelo et al. |
| 5,916,307 A | | 6/1999 | Piskiel et al. |
| 5,930,147 A | | 7/1999 | Takei |
| 5,931,959 A | | 8/1999 | Kwiat |
| 5,933,356 A | | 8/1999 | Rostoker et al. |
| 5,941,999 A | | 8/1999 | Matena et al. |
| 5,963,454 A | | 10/1999 | Dockser et al. |
| 6,018,793 A | | 1/2000 | Rao |
| 6,023,742 A | | 2/2000 | Ebeling et al. |
| 6,028,939 A | | 2/2000 | Yin |
| 6,049,222 A | | 4/2000 | Lawman |
| 6,096,091 A | | 8/2000 | Hartmann |
| 6,108,693 A | | 8/2000 | Tamura |
| 6,112,288 A | | 8/2000 | Ullner |
| 6,128,755 A | | 10/2000 | Bello et al. |
| 6,192,384 B1 | | 2/2001 | Dally et al. |
| 6,205,516 B1 | | 3/2001 | Usami |
| 6,216,191 B1 | | 4/2001 | Britton et al. |
| 6,216,252 B1 | | 4/2001 | Dangelo et al. |
| 6,237,054 B1 | | 5/2001 | Freitag, Jr. |
| 6,247,118 B1 | | 6/2001 | Zumkehr et al. |
| 6,253,276 B1 | | 6/2001 | Jeddeloh |
| 6,282,627 B1 | | 8/2001 | Wong et al. |
| 6,308,311 B1 | | 10/2001 | Carmichael et al. |
| 6,324,678 B1 | | 11/2001 | Dangelo et al. |
| 6,326,806 B1 | | 12/2001 | Fallside et al. |
| 6,470,482 B1 | | 10/2002 | Rostoker et al. |
| 6,624,819 B1 | | 9/2003 | Lewis |
| 6,625,749 B1 | | 9/2003 | Quach |
| 6,662,285 B1 | | 12/2003 | Douglass et al. |
| 6,684,314 B1 | | 1/2004 | Manter |
| 6,704,816 B1 | | 3/2004 | Burke |
| 6,769,072 B1 | | 7/2004 | Kawamura et al. |
| 6,785,841 B2 | | 8/2004 | Akrout et al. |
| 6,785,842 B2 | | 8/2004 | Zumkehr et al. |
| 6,829,697 B1 | | 12/2004 | Davis et al. |
| 6,839,873 B1 | | 1/2005 | Moore |
| 6,982,976 B2 | | 1/2006 | Galicki et al. |
| 6,985,975 B1 | | 1/2006 | Chamdani et al. |
| 7,024,654 B2 | | 4/2006 | Bersch et al. |
| 7,036,059 B1 | | 4/2006 | Carmichael et al. |
| 7,073,158 B2 | | 7/2006 | McCubbrey |
| 7,106,715 B1 * | | 9/2006 | Kelton et al. ................ 370/338 |
| 7,117,390 B1 | | 10/2006 | Klarer et al. |
| 7,134,047 B2 | | 11/2006 | Quach |
| 7,137,020 B2 | | 11/2006 | Gilstrap et al. |
| 7,228,520 B1 | | 6/2007 | Keller et al. |
| 7,284,225 B1 | | 10/2007 | Ballagh et al. |
| 2001/0014937 A1 | | 8/2001 | Huppenthal et al. |
| 2001/0025338 A1 | | 9/2001 | Zumkehr et al. |
| 2002/0041685 A1 | | 4/2002 | McLoone et al. |
| 2002/0087829 A1 | | 7/2002 | Snyder et al. |
| 2002/0162086 A1 | | 10/2002 | Morgan |
| 2003/0009651 A1 | | 1/2003 | Najam et al. |
| 2003/0014627 A1 | | 1/2003 | Krishna et al. |
| 2003/0061409 A1 | | 3/2003 | RuDusky |
| 2003/0086595 A1 * | | 5/2003 | Hu et al. ..................... 382/128 |
| 2003/0115500 A1 | | 6/2003 | Akrout et al. |
| 2003/0177223 A1 | | 9/2003 | Erickson et al. |
| 2003/0229877 A1 | | 12/2003 | Bersch et al. |
| 2003/0231649 A1 | | 12/2003 | Awoseyi et al. |
| 2004/0019771 A1 | | 1/2004 | Quach |
| 2004/0019883 A1 | | 1/2004 | Banerjee et al. |
| 2004/0045015 A1 | | 3/2004 | Haji-Aghajani et al. |
| 2004/0061147 A1 | | 4/2004 | Fujita et al. |
| 2004/0064198 A1 | | 4/2004 | Reynolds et al. |
| 2004/0130927 A1 | | 7/2004 | Schulz et al. |
| 2004/0133763 A1 | | 7/2004 | Manthur et al. |
| 2004/0136241 A1 * | | 7/2004 | Rapp et al. ............. 365/189.05 |
| 2004/0153752 A1 | | 8/2004 | Sutardja et al. |
| 2004/0170070 A1 | | 9/2004 | Rapp et al. |
| 2004/0181621 A1 | | 9/2004 | Manthur et al. |
| 2004/0203383 A1 * | | 10/2004 | Kelton et al. ................ 455/41.2 |
| 2005/0104743 A1 * | | 5/2005 | Ripolone et al. ......... 340/855.1 |
| 2005/0149898 A1 | | 7/2005 | Hakewill et al. |
| 2006/0123282 A1 | | 6/2006 | Gouldey et al. |
| 2006/0206850 A1 | | 9/2006 | McCubbrey |
| 2006/0236018 A1 | | 10/2006 | Dao et al. |
| 2007/0030816 A1 * | | 2/2007 | Kolavennu .................. 370/252 |
| 2007/0055907 A1 | | 3/2007 | Sutardja et al. |
| 2007/0271545 A1 | | 11/2007 | Eng |

FOREIGN PATENT DOCUMENTS

| | | |
|---|---|---|
| EP | 0161438 | 12/2000 |
| EP | 1061439 | 12/2000 |
| EP | 0945788 | 8/2004 |
| JP | 2001-236496 | 8/2001 |
| JP | 2002-149424 | 5/2002 |

OTHER PUBLICATIONS

Lecurieux-Lafayette G: "Un Seul FPGA Dope Le Traitement D'Images", Electronique, CEP Communication, Paris, FR, No. 55, 1996, pp. 98, 101-103.

Salcic Z et al., "FLIX environment for generation of custom-configurable machines in FPLDs for embedded applications", Microprocessors and Microsystems, IPC Business Press Ltd. London, GB, vol. 23, No. 8-9, Dec. 15, 1999, pp. 513-526.

Vermeulen F. et al., "Flexible Hardware Acceleration for Multimedia Oriented Microprocessors", Micro-33. Proceedings of the 33rd Annual ACM/IEEE International Symposium on Microarchitecture. Monterey, CA, Dec. 10-13, 2000, Proceedings of the Annual ACM/IEEE International Symposium on Microarchitecture, Los Alamitos, CA: IEEE Comp. Soc, US, Dec. 10, 2000, pp. 171-177.

International Search Report for PCT/US 03/34557, Dec. 21, 2004.

International Search Report for PCT/US03/34558 dated Jun. 16, 2005.

International Search Report for PCT/US03/34559 dated Jan. 7, 2005.

"Chips: New Accelerator Chip From Hi/fn to Speed-Up Virtual Private Networks—"VPNs"—Product Announcement", EDGE Publishing, On & About AT&T, Oct. 26, 2008, http://findarticles.com/p/articles/mi_m0UNZ/is_1998_Oct_26/ai_53126574, 2 pages.

Lisa Wu, Chris Weaver, and Todd Austin, "CryptoManiac: A Fast Flexible Architecture for Secure Communication", IEEE 2001, 10 pages.

Free Online Dictionary of Computing (1997) Definitions of "FPGA" and "raw data"; http://foldoc.org.

Hansen (1977) The Architecture of Concurrent Programs; Prentice Hall, Inc.; pp. 16-17, 19-20, 24-27, 47-54, 72-73, 151-152.

Microsoft (1999) Microsoft Computer Dictionary, 4th Edition; Microsoft Press; p. 215.

Microsoft (2002) Microsoft Computer Dictionary, 5th Edition; Microsoft Press; pp. 77-78.

Patterson (1996) Computer Architecture, A Quantitative Approach, $2^{nd}$ Edition; Morgan Kauffman; pp. 134, 155.
International Search Report for PCT/US2005/035818 dated Aug. 4, 2006.
International Search Report for PCT/US2005/035813, Mar. 10, 2005.
International Search Report for PCT/US2005/035814 dated Feb. 23, 2006.
Tanenbaum, "Structured Computer Organization, 2nd Edition", 1984, pp. 10-12.

* cited by examiner

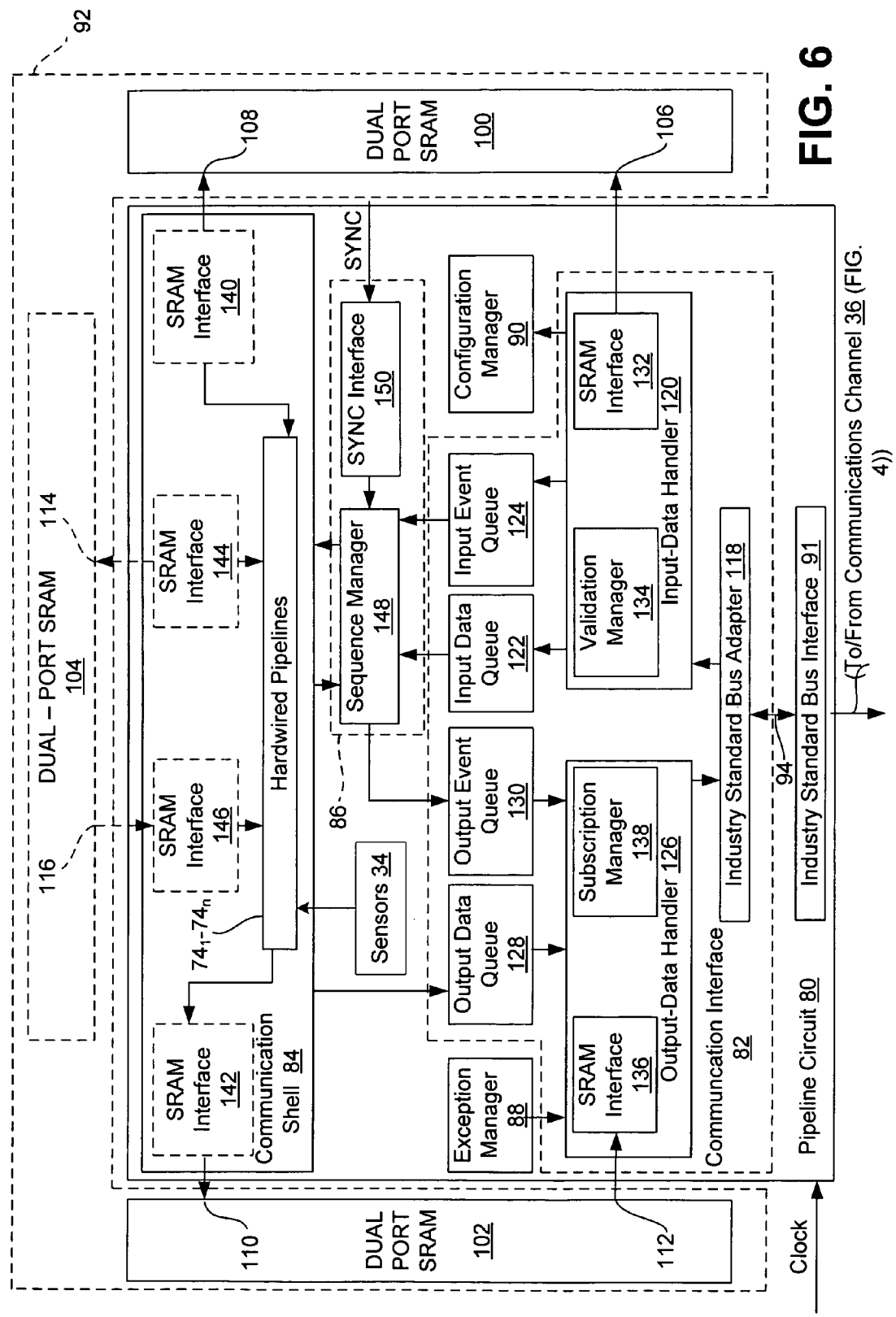

US 7,619,541 B2

REMOTE SENSOR PROCESSING SYSTEM AND METHOD

CLAIM OF PRIORITY

The present application claims priority from U.S. provisional patent application No. 60/615,192, filed on Oct. 1, 2004; U.S. Provisional patent application No. 60/615,157, filed Oct. 1, 2004; U.S. provisional patent application No. 60/615,170 filed Oct. 1, 2004; U.S. provisional patent application No. 60/615,158 filed Oct. 1, 2004; U.S. provisional patent application No. 60/615,193 filed Oct. 1, 2004 and, U.S. provisional patent application No. 60/615,050, filed Oct. 1, 2004, which are incorporated herein by reference in their entirety and for all their teachings and disclosures.

CROSS REFERENCE TO RELATED APPLICATIONS

This application is related to U.S. patent application Ser. No. 10/684,102 entitled IMPROVED COMPUTING ARCHITECTURE AND RELATED SYSTEM AND METHOD, Ser. No. 10/684,053 entitled COMPUTING MACHINE HAVING IMPROVED COMPUTING ARCHITECTURE AND RELATED SYSTEM AND METHOD, Ser. No. 10/684,057 entitled PROGRAMMABLE CIRCUIT AND RELATED COMPUTING MACHINE AND METHOD and Ser. No. 10/683,932 entitled PIPELINE ACCELERATOR HAVING MULTIPLE PIPELINE UNITS AND RELATED COMPUTING MACHINE AND METHOD, which have a common filing date and owner and which are incorporated by reference.

BACKGROUND

Many systems, such as sonar systems, include sensors that are remote from computing or processing circuitry that processes data received from the sensors or data that is sent to the sensors. FIG. 1 is functional block diagram that illustrates such a system 10, with sensors 12 being physically separated from remote processing circuitry 14. The sensors 12 are electrically connected to the remote processing circuitry 14 through respective filaments or cables 16. Where the system 10 is a sonar system, for example, the sensors 12 typically form a sensor array positioned on an exterior submerged portion of ship or submarine. Each of the sensors 12 is connected through a respective one of the cables 16 to the remote processing circuitry 14 located in a control or equipment room of the ship or submarine. The distance between the sensors 12 and the remote processing circuitry 14 may be quite long, requiring the cables 16 to extend relatively long distances to interconnect the two. Another example of the system 10 is a nuclear power plant, which has the sensors 12 embedded within the reactor for monitoring operating conditions. The sensors 12 are coupled through cables 16 embedded within the reactor walls and which extend relatively long distances to interconnect the sensors to remote processing circuitry 14 for controlling the overall operation of the power plant.

In the system 10, problems with the sensors 12 and cables 16 may occur over time. First, the cables 16 may be of a relatively poor quality, meaning the bandwidth of the cables is relatively low. This could be true because the system 10 is relatively old and, for example, when installed the cables 16 were envisioned as being used only for low bandwidth transmission of analog signals. As a result, the bandwidth of the cables 16 may limit the use of new more reliable sensors 12. For example, the use of digital sensors 12 that perform analog-to-digital conversion locally at the sensors may not be utilized in some instances due to the bandwidth limitations of the existing cables 16. The bandwidth of the cables 16 may in this way preclude the use of newer higher data rate sensors 12.

Due to the bandwidth limitations of the cables 16, in many instances the upgrading of the system 10 to utilize new higher data rate sensors 12 requires the cables 16 also be upgraded. Inherent characteristics of the system 10, however, may in many situations make such an electrically straightforward solution unfeasible. The cost to upgrade the cables 16 may be prohibitive, for example, thus precluding upgrade of the sensors 12. For example, where the system 10 is a nuclear power plant and the cables 16 are embedded within the nuclear reactor, the cost of shutting down the reactor, tearing out the cables from within the reactor, installing new cables, and then repairing the reactor walls from which the cables were removed may make the upgrading of the sensors 12 unfeasible. This means that with existing systems 10, the utilization of newer and higher performance sensors 12 is not available in many instances even though the use of such sensors would increase the overall performance of the system 10.

There is a need for a system and method for allowing sensors to be upgraded in systems having sensors physically separated from remote processing circuitry without the need to replace cables interconnecting the sensors and processing circuitry.

SUMMARY

According to one aspect of the present invention, a sensor assembly includes a sensor operable to sense a physical parameter and generate an electrical signal responsive to the sensed physical parameter. Local processing circuitry is physically positioned proximate the sensor and is electrically coupled to the sensor. The local processing circuitry includes an output port adapted to be coupled to a communications channel and the local processing circuitry is operable to process data from the sensor to generate processed sensor data and to provide the processed data on the output port.

BRIEF DESCRIPTION OF THE DRAWINGS

FIG. 6 is an even more detailed block diagram of the hardwired pipeline circuit and the data memory of FIG. 5 according to one embodiment of the present invention.

DETAILED DESCRIPTION

Figure 1:
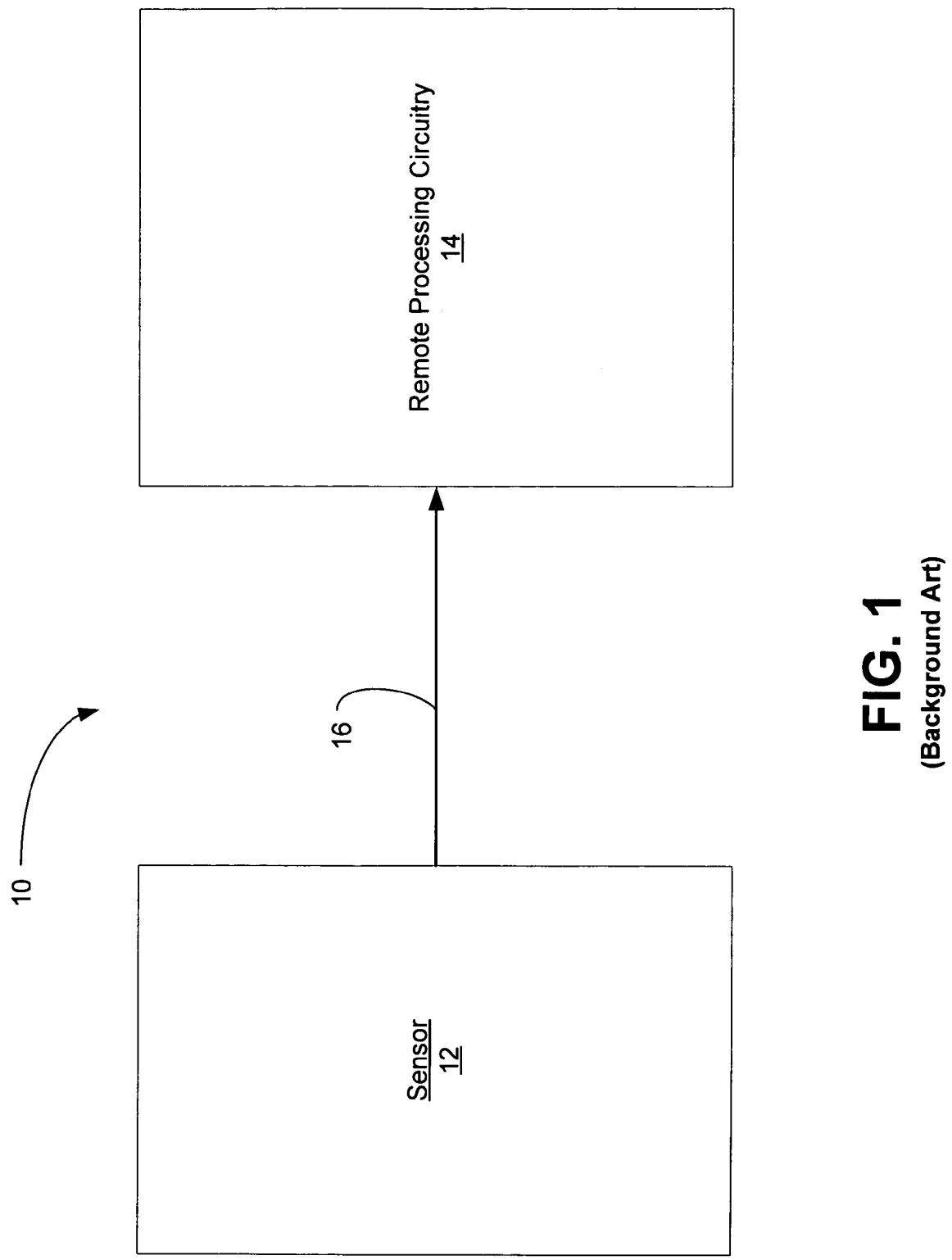
FIG. 1 is a functional block diagram of a conventional system including sensors coupled through communications channels or cables to remote processing circuitry.
Figure 2:
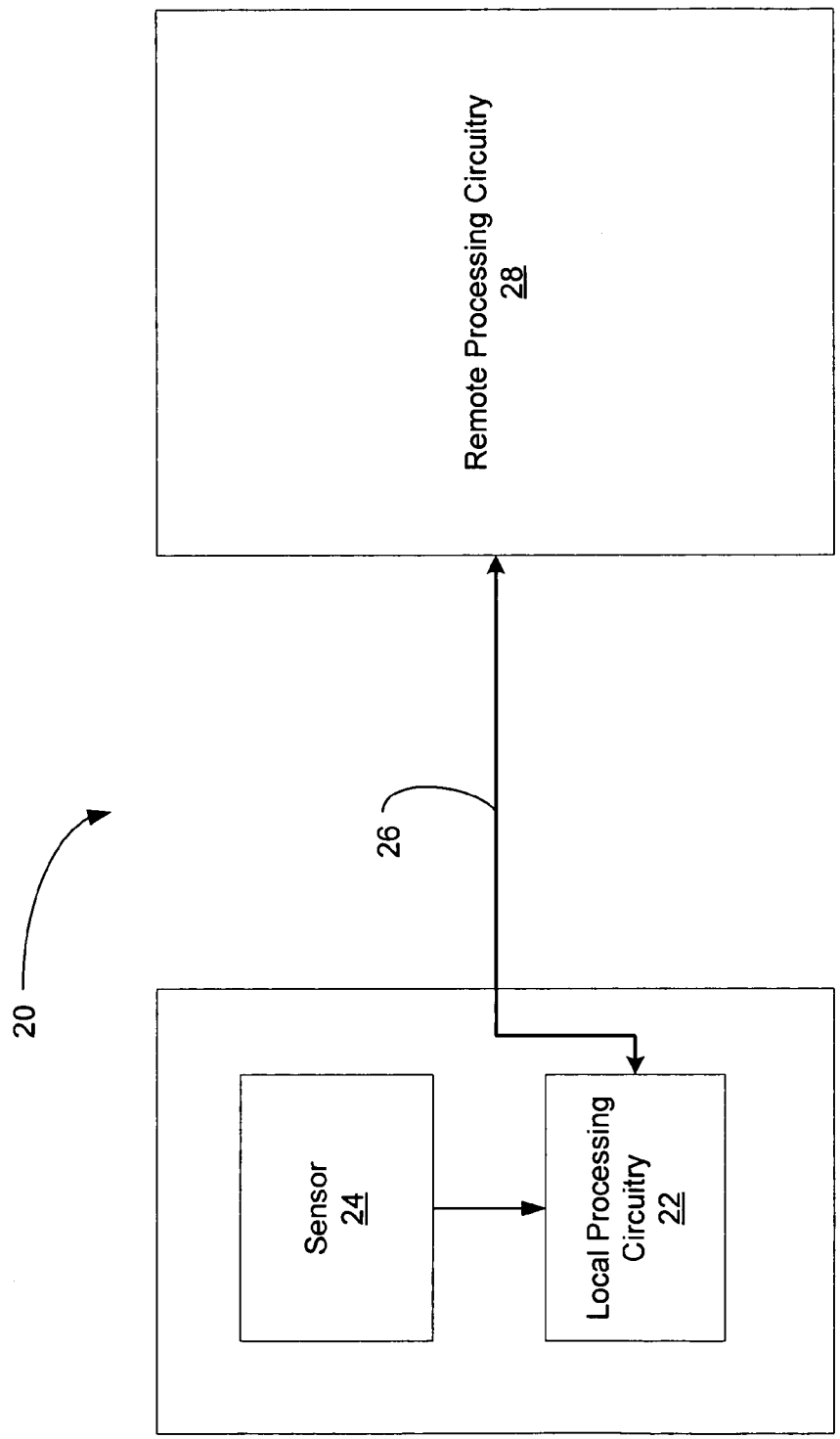
FIG. 2 is a functional block diagram of a system including local processing circuitry positioned proximate associated sensors for processing data from the sensors prior to communicating sensor data to remote processing circuitry according to one embodiment of the present invention.

FIG. 2 is a functional block diagram of a system 20 according to one embodiment of the present invention. The system 20 includes local processing circuitry 22 positioned proximate associated sensors 24 for processing data from the sensors prior to communicating processed sensor data over a communications channel 26 to remote processing circuitry 28, as will be described in more detail below. In operation, the local processing circuitry 22 processes data from the sensors 24 prior to communicating corresponding sensor data over the communications channel 26, which was referred to as the cable 106 in the conventional system 100 of FIG. 1. This reduces the amount of data that must be communicated over the channel 26 to the remote processing circuitry 28, meaning an existing low bandwidth channel may be utilized.

Even utilizing the local processing circuitry 22, some applications may still require a bandwidth that is greater than the bandwidth of the existing communications channel 26. In these situations, the local processing circuitry 22 may implement a bandwidth-enhancement technique such as one of the digital subscriber line (DSL) technologies, which are commonly referred to as "xDSL" technologies. These technologies include asymmetric DSL (ADSL), high-data-rate DSL (HDSL), very high DSL (VDSL), and symmetric DSL (SDSL) where a high data transfer rate to and from the remote processing circuitry 28 is required. The DSL technologies are sophisticated modulation techniques that effectively increase the bandwidth of the communications channel 26 without requiring replacement of the channel, as will be appreciated by those skilled in the art.

In another embodiment, a new computing architecture referred to as a peer vector machine (PVM) is utilized in the system 20 to allow the sensors 24 to be upgraded without replacing the communications channel 26. With the peer vector machine architecture a host processor forms the remote processing circuitry 28 and controls the overall operation and decision making operations of the system 20. A pipeline accelerator forms the local processing circuitry 22 and performs mathematically intensive operations on data. The pipeline accelerator and host processor are "peers" and communicate with each through data vectors transferred over the communications channel 26. All these embodiments of the present invention will be described in more detail below.

Still referring to FIG. 2, in the system 20 the sensors 24 may be replaced with newer sensors without the need to replace the older relatively low bandwidth communications channel 26. Such newer sensors 24 may be faster, more reliable, and more accurate than the older sensors being replaced. The ability to replace the sensors 24 without replacing the channel 26 is particularly useful in systems where the channel is not easily replaced, such as where the channel corresponds to cables coupled to sonar sensors on board a ship or cables contained within the walls of a nuclear reactor, as discussed above with reference to FIG. 1. More specifically, when the sensors 24 in the system 20 need to be replaced, the sensors themselves are simply removed and replaced with new sensors coupled to suitable local processing circuitry 22 for processing signals from the sensors.

The local processing circuitry 22 processes the signals from the sensors 24 to generate corresponding sensor data, and thereafter communicates this sensor data via the communications channel 26 to the remote processing circuitry 28.

The specific type of processing performed by the local processing circuitry 22 varies and depends on the specific type of system. For example, where the system 20 is a sonar system the sensors 24 may correspond to a sensor array, and the local processing circuitry 22 may process signals from each of the sensors in the sensor array to calculate a direction vector for an object being tracked. Having calculated the direction vector, the local processing circuitry 22 then communicates data corresponding to this vector over the channel 26 to the remote processing circuitry 28. The local processing circuitry 22 eliminates the need to communicate the data from all sensors 24 in the array over the channel 26 for processing by the circuitry 28. This may enable an existing relatively low bandwidth channel 26 to be utilized while allowing the sensors 24 to be upgraded. In another example, the remote processing circuitry 28 may apply commands to the local processing circuitry 22 via the communications channel 26, and in response to these commands the local processing circuitry may condition data from the sensors 24 appropriately and send only the desired data. The remote processing circuitry 28 may, for example, send a command via the channel 26 to the local processing circuitry 22 so as to adjust the gains of the sensors 24 or to specify a frequency band of interest so that the local processing circuitry only sends data corresponding to this frequency band over the communications channel 26 to the remote processing circuitry 28.

Sensors as discussed herein include a transducer portion that senses a physical parameter, such as pressure, temperature, acceleration, and so on, and generates an electrical signal responsive to the sensed physical parameter. Each sensor may also include associated electronic circuitry for conditioning the electrical signal, such as filtering circuitry and an analog-to-digital converter for digitizing the analog electrical signal. A sensor may also include a digital-to-analog converter for converting an applied digital value into a corresponding analog electrical signal which, in turn, the transducer portion of the sensor converts into a physical quantity such as a sound wave.

Even with the local processing circuitry 22 the bandwidth of the existing communications channel 26 may be too low to provide the required data transfer rates between the local processing circuitry 22 and remote processing circuitry 28. In this situation, the local processing circuitry 22 and remote processing circuitry 28 may communicate over the communications channel 26 using a bandwidth-enhancement technique such as XDSL as previously mentioned. Using such a technique, the bandwidth of the channel 26 is effectively increased to provide the bandwidth required by the local processing circuitry 22 and remote processing circuitry 28. The bandwidth enhancement technique may be applied for communications over the channel in one direction, e.g., from the local processing circuitry 22 to the remote processing circuitry 28, or in both directions. The ADSL technique could be used in the first instance where the communication is asymmetric or only in one direction, while the SDSL technique could be used in the second situation where bidirectional communications over the channel 26 at a high data transfer rate are required.

Bidirectional communications over the channel 26 may be required in the situation where the system 20 is a sonar system and the array of sensors 24 function as an "active array" to transmit desired signals. In this example, the remote processing circuitry 28 communicates data via SDSL over the channel 26 to the remote processing circuitry 22. In response to the received data, the local processing circuitry 22 then applies signals to sensors 24 in the sensor array that causes the sensors to convert the received signal into a corresponding sound wave. As will be appreciated by those skilled in the art, where the system 20 is a sonar system the sensors 24 convert sound waves incident upon the sensors into corresponding electrical signals and where the array is an active array the sensors convert applied electrical signals into corresponding sound waves.

Figure 3:
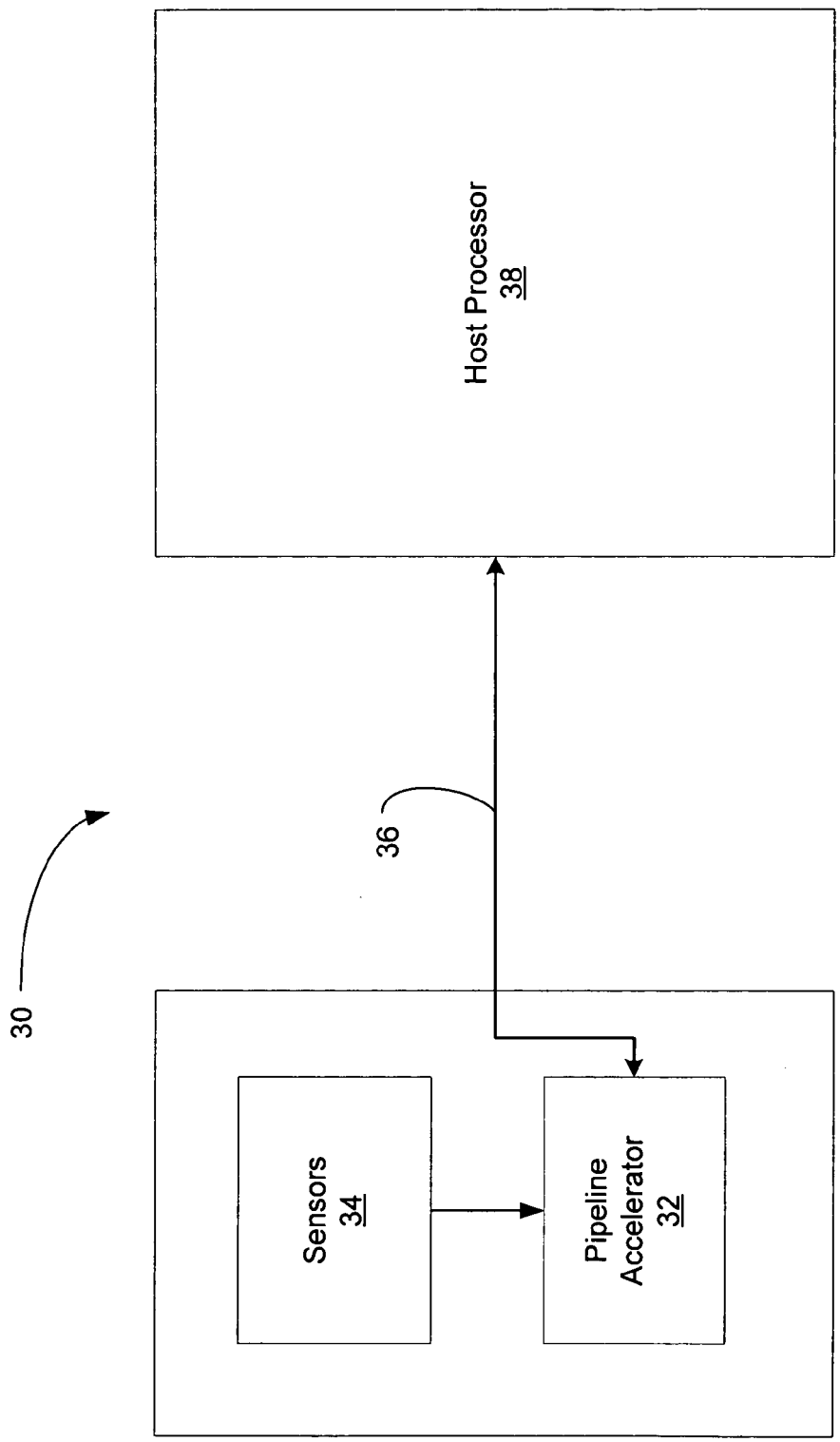
FIG. 3 is a block diagram of a system including a peer vector machine corresponding to the local and remote processing circuitry of FIG. 2 according to another embodiment of the present invention.

In many situations there may be space limitations as to the overall size of the local processing circuitry 22 and new sensors 24. The old sensors 24 occupied a certain amount of space in the system and this space cannot be increased, so the new sensors and associated local processing circuitry 22 needs to be fit into that same space. This situation requires a high level of integration of the circuitry forming the local processing circuitry 22. A peer vector machine (PVM) architecture as illustrated in FIG. 3 is particularly advantageous in this situation, as previously mentioned and as will now be explained in more detail. FIG. 3 illustrates a system 30 including a pipeline accelerator 32 coupled to sensors 34 and coupled through a communications channel 36 to a host processor 38. The sensors 34 and channel 36 are the same as that discussed with reference to FIG. 2, and thus will not again be described in more detail. A firmware memory (not shown in FIG. 3) is coupled to pipeline accelerator 32 and stores configuration data to configure programmable hardware in the pipeline accelerator 32 to perform desired functions without executing programming instructions, as will be explained in more detail below.

In the system 30 the peer vector machine architecture divides the processing power of the system into two primary components, the pipeline accelerator 32 and host processor 38 that together form the peer vector machine. In the system 30 the pipeline accelerator 32 forms the local processing circuitry 202 of FIG. 2 and the host processor 38 forms the remote processing circuitry 208 of FIG. 2. The host processor 38 performs a portion of the overall computing burden of the system 30 and primarily handles all decision making operations of the system. The pipeline accelerator 32 on the other hand does not execute any programming instructions and handles the remaining portion of the processing burden, primarily performing mathematically intensive or "number crunching" types of operations. The host-processor 38 and the pipeline accelerator 32 are termed "peers" that transfer data vectors back and forth via the communications channel 36. By combining the decision-making functionality of the host processor 38 and the number-crunching functionality of the pipeline accelerator 32, the use of the peer vector machine enables the system 30 to process data faster than conventional computing architectures such as multiprocessor architectures, as will be discussed in more detail below.

With the peer vector machine architecture, the pipeline accelerator 32 may be implemented through programmable logic integrated circuits (PLICs) that greatly reduce the size of the circuitry that is contained proximate the sensors 34, which may be required to upgrade sensors in existing systems as previously discussed. Finally, and as will also be discussed in more detail below, the pipeline accelerator 32 communicates with the host processor 38 over the communications channel 36 typically through an industry standard communications interface (not shown). The use of such a standard communications interface simplifies the design and modification of the pipeline accelerator 32 and overall system 30, as will also be discussed in more detail below.

Figure 3A:
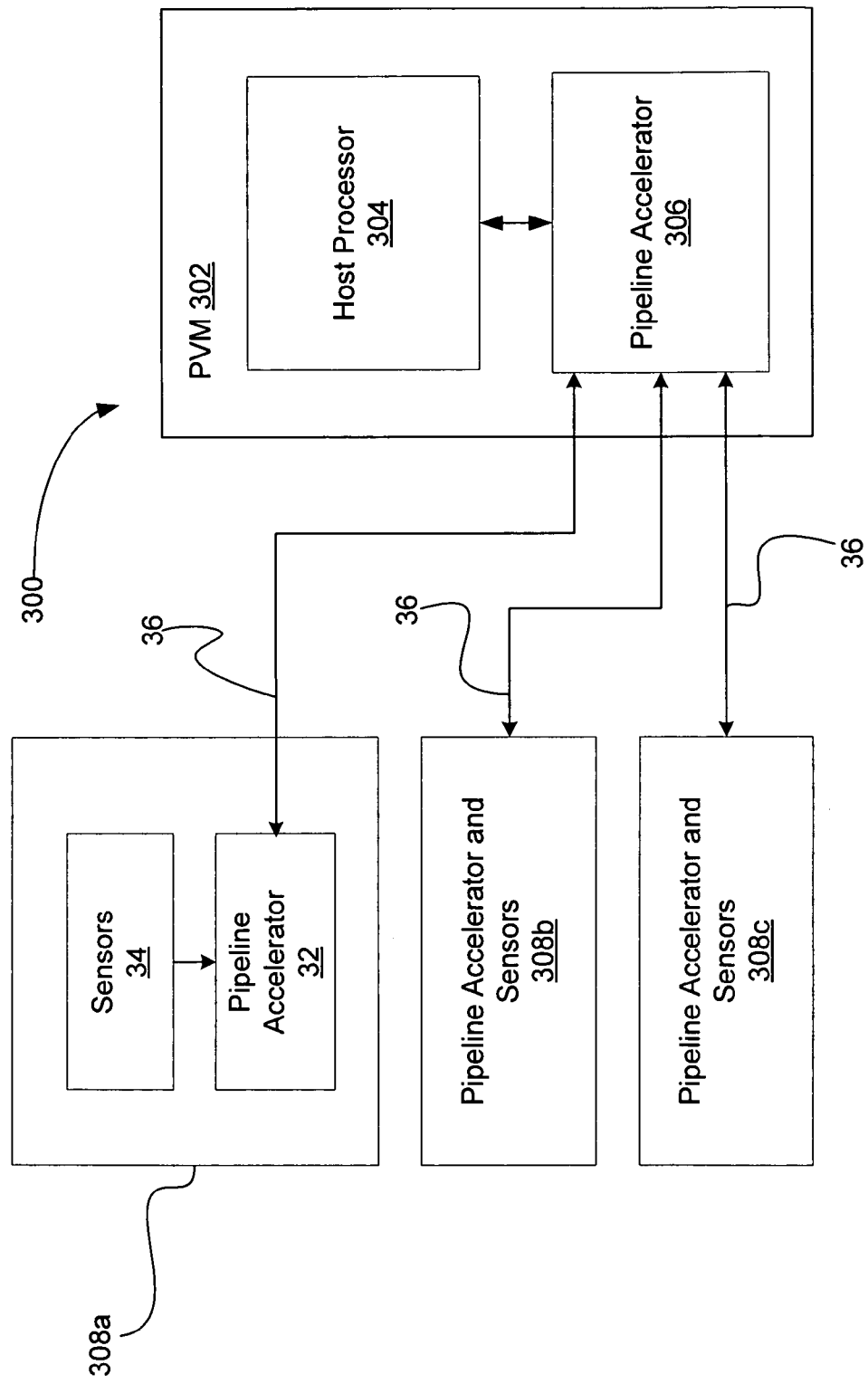
FIG. 3A illustrates a system in which a peer vector machine is coupled through respective communications channels to pipeline accelerator and sensor units according to another embodiment of the present invention.

FIG. 3A illustrates a system 300 including a peer vector machine 302 containing a host processor 304 and pipeline accelerator 306 coupled through respective communications channels 36 to pipeline accelerator and sensor units 308a-c according to another embodiment of the present invention. As shown in more detail for the unit 308a, each unit 308 includes sensors 34 coupled to a corresponding pipeline accelerator 32. Each accelerator 32 receives data from the corresponding sensor 34, processes this data, and communicates this processed data over the corresponding communications channel 36. Where communications over the channels 36 are through a bandwidth-enhancement protocol such as xDSL, one of the pipeline units (not shown) in the pipeline accelerator is configured to form the required interface to perform these communications. The same is true of one of the pipeline units (not shown) in the pipeline accelerator 306 in the peer vector machine 302.

Figure 4:
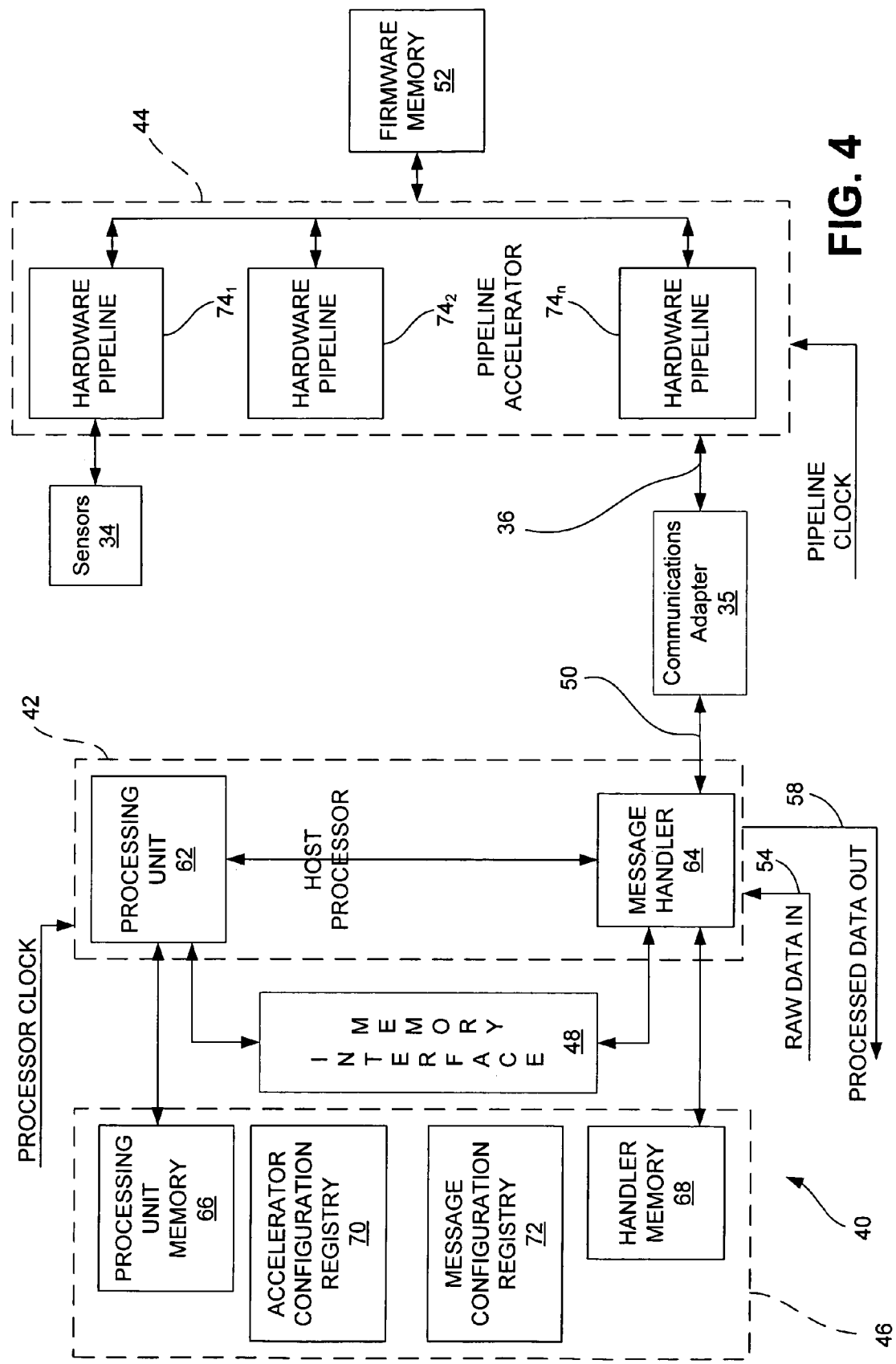
FIG. 4 is a more detailed functional block diagram of one embodiment of the host processor and pipeline accelerator of the peer vector machine of FIG. 3.

FIG. 4 is a more detailed functional block diagram of a peer vector machine 40 that may be included in the system 30 of FIG. 3 according to one embodiment of the present invention. The peer vector machine 40 includes a host processor 42 corresponding to the host processor 38 of FIG. 3 and a pipeline accelerator 44 corresponding to the pipeline accelerator 32 of FIG. 3. The host processor 42 communicates with the pipeline accelerator 44 over the communications channel 36 (FIG. 3) and through a communications adapter 35. The communications interface 35 and host processor 42 communicate data over the communications channel 36 according to an industry standard interface in one embodiment of present invention, which facilitates the design and modification of the machine 40. If the circuitry in the pipeline accelerator 44 changes, the communications adapter 35 need merely be modified to interface this new accelerator to the channel 36. In the example embodiment of FIG. 4, the sensors 34 are coupled directly to one of a plurality of hardware or hardwired pipelines $74_{1-n}$ in the pipeline accelerator 44. The hardwired pipeline $74_1$ processes data without executing program instructions, as do each of the pipelines 74 to perform required tasks. A firmware memory 52 stores the configuration firmware for the accelerator 44 to configure the hardwired pipelines 74 to execute these tasks, as will be described in more detail below.

The peer vector machine 40 generally and the host processor 42 and pipeline accelerator 44 more specifically are described in more detail in U.S. patent application Ser. No. 10/684,102 entitled IMPROVED COMPUTING ARCHITECTURE AND RELATED SYSTEM AND METHOD, application Ser. No. 10/684,053 entitled COMPUTING MACHINE HAVING IMPROVED COMPUTING ARCHITECTURE AND RELATED SYSTEM AND METHOD, application Ser. No. 10/683,929 entitled PIPELINE ACCELERATOR FOR IMPROVED COMPUTING ARCHITECTURE AND RELATED SYSTEM AND METHOD application. Ser. No. 10/684,057 entitled PROGRAMMABLE CIRCUIT AND RELATED COMPUTING MACHINE AND METHOD, and Ser. No. 10/683,932 entitled PIPELINE ACCELERATOR HAVING MULTIPLE PIPELINE UNITS AND RELATED COMPUTING MACHINE AND METHOD, all of which have a common filing date of Oct. 9, 2003 and a common owner and which are incorporated herein by reference.

In addition to the host processor 42 and the pipeline accelerator 44, the peer vector computing machine 40 includes a processor memory 46, an interface memory 48, a bus 50, a firmware memory 52, an optional raw-data input port 54, a processed-data output port 58, and an optional router 61.

The host processor 42 includes a processing unit 62 and a message handler 64, and the processor memory 46 includes a processing-unit memory 66 and a handler memory 68, which respectively serve as both program and working memories for the processor unit and the message handler. The processor memory 46 also includes an accelerator-configuration registry 70 and a message-configuration registry 72, which store respective configuration data that allow the host processor 42 to configure the functioning of the accelerator 44 and the format of the messages that the message handler 64 sends and receives.

The pipeline accelerator 44 is disposed on at least one programmable logic integrated circuit (PLIC) (not shown) and includes hardwired pipelines $74_1\text{-}74_n$, which process respective data without executing program instructions. The firmware memory 52 stores the configuration firmware for the accelerator 44. If the accelerator 44 is disposed on multiple PLICs, these PLICs and their respective firmware memories may be disposed in multiple pipeline units (FIG. 4). The accelerator 44 and pipeline units are discussed further below and in previously cited U.S. patent application Ser. No. 10/683,932 entitled PIPELINE ACCELERATOR HAVING MULTIPLE PIPELINE UNITS AND RELATED COMPUTING MACHINE AND METHOD, Alternatively, the accelerator 44 may be disposed on at least one application specific integrated circuit (ASIC), and thus may have internal interconnections that are not configurable. In this alternative, the machine 40 may omit the firmware memory 52. Furthermore, although the accelerator 44 is shown including multiple pipelines 74, it may include only a single pipeline. In addition, although not shown, the accelerator 44 may include one or more processors such as a digital-signal processor (DSP).

As previously mentioned, in the embodiment of FIG. 4 the sensors 34 are shown coupled to the pipeline bus 50, which corresponds to the communications channel 36 of FIG. 3. In this embodiment, the sensors 34 would of course include suitable circuitry for communicating raw data from the sensors over the pipeline bus, typically through an industry standard communications protocol or interface such as RapidIO. In another embodiment, the sensors 34 are coupled to the bus 50 and communicate data via the bus to the pipeline accelerator 44. The data provided is stored in memory (not shown) in the pipeline accelerator 44, and is read out of memory and processed by the appropriate one of the hardware pipelines 74. The accelerator 44 may further include a data output port for directly supplying data to the sensors 34, which corresponds to the interconnection between the sensors and pipeline $74_1$ in FIG. 4. The pipeline accelerator 44 can supply data to the sensors 34 where the system 30 containing the peer vector machine 40 is a sonar system and the sensors are to be utilized to transmit desired sound waves, as previously mentioned. Data to be supplied to the sensors 34 is supplied over the pipeline bus 50 and communications channel 36 and stored in memory (not shown) in the accelerator 44, and is thereafter retrieved from memory and output through the data output port to the sensors.

Figure 5:
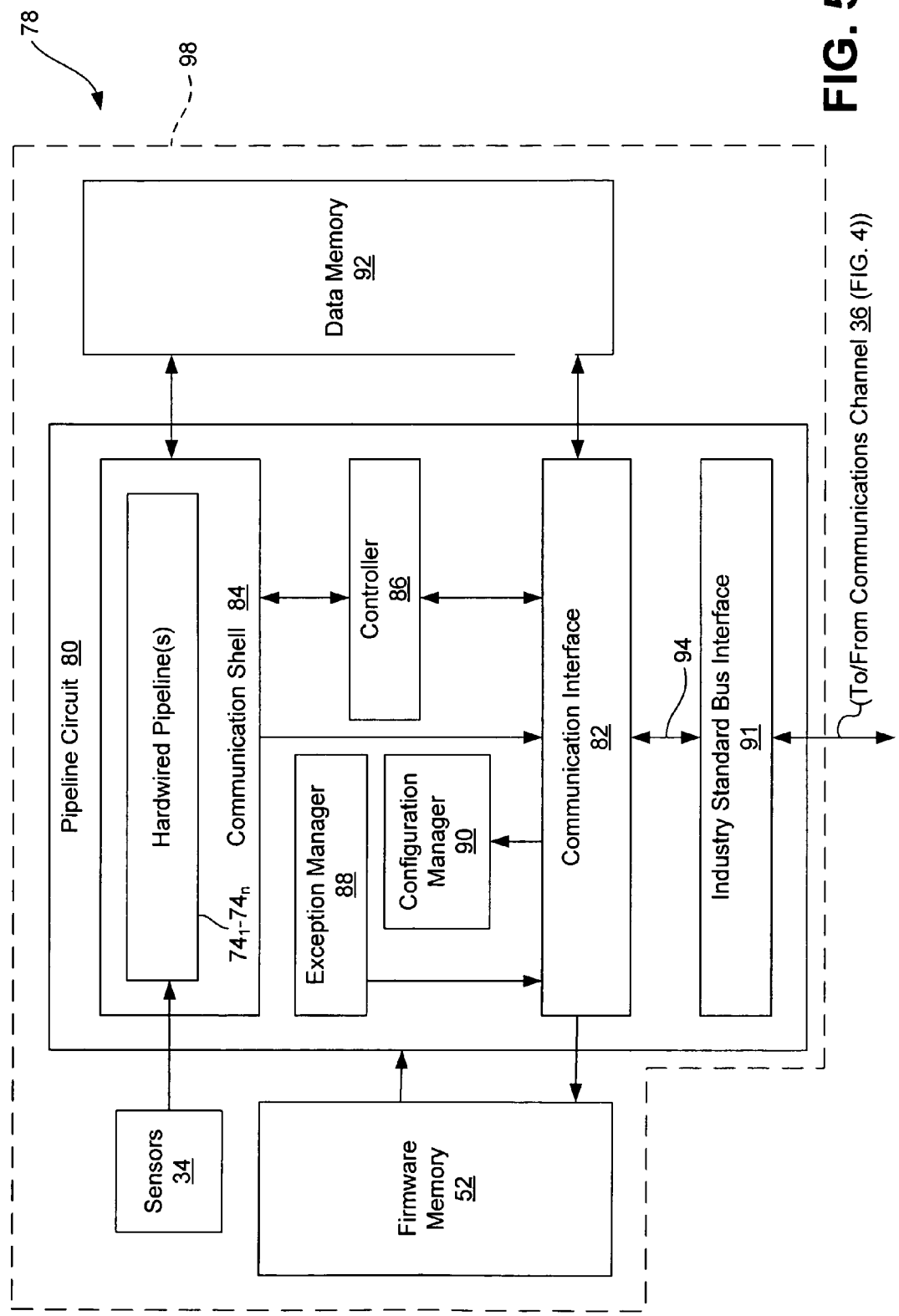
FIG. 5 is a more detailed block diagram of the pipeline accelerator of FIG. 4 according to one embodiment of the present invention.

FIG. 5 is a more detailed block diagram of the pipeline accelerator 44 of FIG. 4 according to one embodiment of the present invention. The accelerator 44 includes one or more pipeline units 78, one of which is shown in FIG. 5. Each pipeline unit 78 includes a pipeline circuit 80, such as a PLIC or an ASIC. As discussed further below and in previously cited U.S. patent application Ser. No. 10/683,932 entitled PIPELINE ACCELERATOR HAVING MULTIPLE PIPELINE UNITS AND RELATED COMPUTING MACHINE AND METHOD, each pipeline unit 78 is a "peer" of the host processor 42 and of the other pipeline units of the accelerator 44. That is, each pipeline unit 78 can communicate directly with the host processor 42 or with any other pipeline unit. Thus, this peer-vector architecture prevents data "bottlenecks" that otherwise might occur if all of the pipeline units 78 communicated through a central location such as a master pipeline unit (not shown) or the host processor 42. Furthermore, it allows one to add or remove peers from the peer-vector machine 40 (FIG. 3) without significant modifications to the machine.

The pipeline circuit 80 includes a communication interface 82, which transfers data between a peer, such as the host processor 42 (FIG. 3), and the following other components of the pipeline circuit: the hardwired pipelines $74_1\text{-}74_n$ (FIG. 3) via a communication shell 84, a controller 86, an exception manager 88, and a configuration manager 90. The pipeline circuit 80 may also include an industry-standard bus interface 91. Alternatively, the functionality of the interface 91 may be included within the communication interface 82. Where a bandwidth-enhancement technique such as xDSL is utilized to increase the effective bandwidth of the pipeline bus 50, the communication interface 82 and bus interface 91 are modified as necessary to implement the bandwidth-enhancement technique, as will be appreciated by those skilled in the art.

The communication interface 82 sends and receives data in a format recognized by the message handler 64 (FIG. 4), and thus typically facilitates the design and modification of the peer-vector machine 40 (FIG. 4). For example, if the data format is an industry standard such as the Rapid I/O format, then one need not design a custom interface between the host processor 42 and the accelerator 44. Furthermore, by allowing the pipeline circuit 80 to communicate with other peers, such as the host processor 42 (FIG. 3), via the pipeline bus 50 instead of via a non-bus interface, one can change the number of pipeline units 78 by merely connecting or disconnecting them (or the circuit cards that hold them) to the pipeline bus instead of redesigning a non-bus interface from scratch each time a pipeline unit is added or removed.

The hardwired pipelines $74_1\text{-}74_n$ perform respective operations on data as discussed above in conjunction with FIG. 3 and in previously cited U.S. patent application Ser. No. 10/684,102 entitled IMPROVED COMPUTING ARCHITECTURE AND RELATED SYSTEM AND METHOD, and the communication shell 84 interfaces the pipelines to the other components of the pipeline circuit 80 and to circuits (such as a data memory 92 discussed below) external to the pipeline circuit.

The controller 86 synchronizes the hardwired pipelines $74_1\text{-}74_n$ and monitors and controls the sequence in which they perform the respective data operations in response to communications, i.e., "events," from other peers. For example, a peer such as the host processor 42 may send an event to the pipeline unit 78 via the pipeline bus 50 to indicate that the peer has finished sending a block of data to the pipeline unit and to cause the hardwired pipelines $74\text{-}74_n$ to begin processing this data. An event that includes data is typically called a message, and an event that does not include data is typically called a "door bell." Furthermore, as discussed below in conjunction with FIG. 5, the pipeline unit 78 may also synchronize the pipelines $74_1\text{-}74_n$ in response to a synchronization signal.

The exception manager 88 monitors the status of the hardwired pipelines $74_1\text{-}74_n$, the communication interface 82, the communication shell 84, the controller 86, and the bus interface 91, and reports exceptions to the host processor 42 (FIG. 3). For example, if a buffer in the communication interface 82 overflows, then the exception manager 88 reports this to the host processor 42. The exception manager may also correct, or attempt to correct, the problem giving rise to the exception. For example, for an overflowing buffer, the exception manager 88 may increase the size of the buffer, either directly or via the configuration manager 90 as discussed below.

The configuration manager 90 sets the soft configuration of the hardwired pipelines $74_1\text{-}74_n$, the communication interface 82, the communication shell 84, the controller 86, the exception manager 88, and the interface 91 in response to soft-configuration data from the host processor 42 (FIG. 3)—as discussed in previously cited U.S. patent application Ser. No. 10/684,102 entitled IMPROVED COMPUTING ARCHITECTURE AND RELATED SYSTEM AND METHOD, the hard configuration denotes the actual topology, on the transistor and circuit-block level, of the pipeline circuit 80, and the soft configuration denotes the physical parameters (e.g., data width, table size) of the hard-configured components. That is, soft configuration data is similar to the data that can be loaded into a register of a processor (not shown in FIG. 4) to set the operating mode (e.g., burst-memory mode) of the processor. For example, the host processor 42 may send soft-configuration data that causes the configuration manager 90 to set the number and respective priority levels of queues in the communication interface 82. The exception manager 88 may also send soft-configuration data that causes the configuration manager 90 to, e.g., increase the size of an overflowing buffer in the communication interface 82.

Still referring to FIG. 5, in addition to the pipeline circuit 80, the pipeline unit 78 of the accelerator 44 includes the data memory 92, an optional communication bus 94, and, if the pipeline circuit is a PLIC, the firmware memory 52 (FIG. 4). The data memory 92 buffers data as it flows between another peer, such as the host processor 42 (FIG. 4), and the hardwired pipelines $74_1$-$74_n$, and is also a working memory for the hardwired pipelines. The communication interface 82 interfaces the data memory 92 to the pipeline bus 50 (via the communication bus 94 and industry-standard interface 91 if present), and the communication shell 84 interfaces the data memory to the hardwired pipelines $74_1$-$74_n$.

The industry-standard interface 91 is a conventional bus-interface circuit that reduces the size and complexity of the communication interface 82 by effectively offloading some of the interface circuitry from the communication interface. Therefore, if one wishes to change the parameters of the pipeline bus 50 or router 61 (FIG. 4), then he need only modify the interface 91 and not the communication interface 82. Alternatively, one may dispose the interface 91 in an IC (not shown) that is external to the pipeline circuit 80. Offloading the interface 91 from the pipeline circuit 80 frees up resources on the pipeline circuit for use in, e.g., the hardwired pipelines $74_1$-$74_n$ and the controller 86. Or, as discussed above, the bus interface 91 may be part of the communication interface 82.

As discussed above in conjunction with FIG. 5, where the pipeline circuit 80 is a PLIC, the firmware memory 52 stores the firmware that sets the hard configuration of the pipeline circuit. The memory 52 loads the firmware into the pipeline circuit 80 during the configuration of the accelerator 44, and may receive modified firmware from the host processor 42 (FIG. 4) via the communication interface 82 during or after the configuration of the accelerator. The loading and receiving of firmware is further discussed in previously cited U.S. patent application Ser. No. 10/684,057 entitled PROGRAMMABLE CIRCUIT AND RELATED COMPUTING MACHINE AND METHOD.

Still referring to FIG. 5, the pipeline circuit 80, data memory 92, and firmware memory 52 may be disposed on a circuit board or card 98, which may be plugged into a pipeline-bus connector (not shown) much like a daughter card can be plugged into a slot of a mother board in a personal computer (not shown). Although not shown, conventional ICs and components such as a power regulator and a power sequencer may also be disposed on the card 98 as is known sensors 34

Further details of the structure and operation of the pipeline unit 78 will now be discussed in conjunction with FIG. 6. FIG. 6 is a block diagram of the pipeline unit 78 of FIG. 5 according to an embodiment of the invention. For clarity, the firmware memory 52 is omitted from FIG. 6. The pipeline circuit 80 receives a master CLOCK signal, which drives the below-described components of the pipeline circuit either directly or indirectly. The pipeline circuit 80 may generate one or more slave clock signals (not shown) from the master CLOCK signal in a conventional manner. The pipeline circuit 80 may also a receive a synchronization signal SYNC as discussed below. The data memory 92 includes an input dual-port-static-random-access memory (DPSRAM) 100, an output DPSRAM 102, and an optional working DPSRAM 104.

The input DPSRAM 100 includes an input port 106 for receiving data from a peer, such as the host processor 42 (FIG. 3), via the communication interface 82, and includes an output port 108 for providing this data to the hardwired pipelines $74_1$-$74_n$ via the communication shell 84. Having two ports, one for data input and one for data output, increases the speed and efficiency of data transfer to/from the DPSRAM 100 because the communication interface 82 can write data to the DPSRAM while the pipelines $74_1$-$74_n$ read data from the DPSRAM. Furthermore, as discussed above, using the DPSRAM 100 to buffer data from a peer such as the host processor 42 allows the peer and the pipelines $74_1$-$74_n$ to operate asynchronously relative to one and other. That is, the peer can send data to the pipelines $74_1$-$74_n$ without "waiting" for the pipelines to complete a current operation. Likewise, the pipelines $74_1$-$74_n$ can retrieve data without "waiting" for the peer to complete a data-sending operation.

Similarly, the output DPSRAM 102 includes an input port 110 for receiving data from the hardwired pipelines $74_1$-$74_n$ via the communication shell 84, and includes an output port 112 for providing this data to a peer, such as the host processor 42 (FIG. 3), via the communication interface 82. As discussed above, the two data ports 110 (input) and 112 (output) increase the speed and efficiency of data transfer to/from the DPSRAM 102, and using the DPSRAM 102 to buffer data from the pipelines $74_1$-$74_n$ allows the peer and the pipelines to operate asynchronously relative to one another. That is, the pipelines $74_1$-$74_n$ can publish data to the peer without "waiting" for the output-data handler 126 to complete a data transfer to the peer or to another peer. Likewise, the output-data handler 126 can transfer data to a peer without "waiting" for the pipelines $74_1$-$74_n$ to complete a data-publishing operation.

The working DPSRAM 104 includes an input port 114 for receiving data from the hardwired pipelines $74_1$-$74_n$ via the communication shell 84, and includes an output port 116 for returning this data back to the pipelines via the communication shell. While processing input data received from the DPSRAM 100, the pipelines $74_1$-$74_n$ may need to temporarily store partially processed, i.e., intermediate, data before continuing the processing of this data. For example, a first pipeline, such as the pipeline $74_1$, may generate intermediate data for further processing by a second pipeline, such as the pipeline $74_2$; thus, the first pipeline may need to temporarily store the intermediate data until the second pipeline retrieves it. The working DPSRAM 104 provides this temporary storage. As discussed above, the two data ports 114 (input) and 116 (output) increase the speed and efficiency of data transfer between the pipelines $74_1$-$74_n$ and the DPSRAM 104. Furthermore, including a separate working DPSRAM 104 typically increases the speed and efficiency of the pipeline circuit 80 by allowing the DPSRAMs 100 and 102 to function exclusively as data-input and data-output buffers, respectively. But, with slight modification to the pipeline circuit 80, either or both of the DPSRAMS 100 and 102 can also be a working memory for the pipelines 74$_1$-74$_n$ when the DPSRAM 104 is omitted, and even when it is present.

Although the DPSRAMS 100, 102, and 104 are described as being external to the pipeline circuit 80, one or more of these DPSRAMS, or equivalents thereto, may be internal to the pipeline circuit.

Still referring to FIG. 6, the communication interface 82 includes an industry-standard bus adapter 118, an input-data handler 120, input-data and input-event queues 122 and 124, an output-data handler 126, and output-data and output-event queues 128 and 130. Although the queues 122, 124, 128, and 130 are shown as single queues, one or more of these queues may include sub queues (not shown) that allow segregation by, e.g., priority, of the values stored in the queues or of the respective data that these values represent.

The industry-standard bus adapter 118 includes the physical layer that allows the transfer of data between the pipeline circuit 80 and the pipeline bus 50 (FIG. 5) via the communication bus 94 (FIG. 5). Therefore, if one wishes to change the parameters of the bus 94, then he need only modify the adapter 118 and not the entire communication interface 82. Where the industry-standard bus interface 91 is omitted from the pipeline unit 78, then the adapter 118 may be modified to allow the transfer of data directly between the pipeline bus 50 and the pipeline circuit 80. In this latter implementation, the modified adapter 118 includes the functionality of the bus interface 91, and one need only modify the adapter 118 if he/she wishes to change the parameters of the bus 50. For example, where a bandwidth-enhancement technique such as ADSL is utilized to communicate data over the bus 50 the adapter 118 is modified accordingly to implement the bandwidth-enhancement technique.

The input-data handler 120 receives data from the industry-standard adapter 118, loads the data into the DPSRAM 100 via the input port 106, and generates and stores a pointer to the data and a corresponding data identifier in the input-data queue 122. If the data is the payload of a message from a peer, such as the host processor 42 (FIG. 3), then the input-data handler 120 extracts the data from the message before loading the data into the DPSRAM 100. The input-data handler 120 includes an interface 132, which writes the data to the input port 106 of the DPSRAM 100 and which is further discussed below in conjunction with FIG. 6. Alternatively, the input-data handler 120 can omit the extraction step and load the entire message into the DPSRAM 100. The input-data handler 120 also receives events from the industry-standard bus adapter 118, and loads the events into the input-event queue 124.

Furthermore, the input-data handler 120 includes a validation manager 134, which determines whether received data or events are intended for the pipeline circuit 80. The validation manager 134 may make this determination by analyzing the header (or a portion thereof) of the message that contains the data or the event, by analyzing the type of data or event, or the analyzing the instance identification (i.e., the hardwired pipeline 74 for which the data/event is intended) of the data or event. If the input-data handler 120 receives data or an event that is not intended for the pipeline circuit 80, then the validation manager 134 prohibits the input-data handler from loading the received data/even. Where the peer-vector machine 40 includes the router 61 (FIG. 3) such that the pipeline unit 78 should receive only data/events that are intended for the pipeline unit, the validation manager 134 may also cause the input-data handler 120 to send to the host processor 42 (FIG. 3) an exception message that identifies the exception (erroneously received data/event) and the peer that caused the exception.

The output-data handler 126 retrieves processed data from locations of the DPSRAM 102 pointed to by the output-data queue 128, and sends the processed data to one or more peers, such as the host processor 42 (FIG. 3), via the industry-standard bus adapter 118. The output-data handler 126 includes an interface 136, which reads the processed data from the DPSRAM 102 via the port 112. The interface 136 is further discussed below in conjunction with FIG. 7. The output-data handler 126 also retrieves from the output-event queue 130 events generated by the pipelines 74$_1$-74$_n$, and sends the retrieved events to one or more peers, such as the host processor 42 (FIG. 3) via the industry-standard bus adapter 118.

Furthermore, the output-data handler 126 includes a subscription manager 138, which includes a list of peers, such as the host processor 42 (FIG. 3), that subscribe to the processed data and to the events; the output-data handler uses this list to send the data/events to the correct peers. If a peer prefers the data/event to be the payload of a message, then the output-data handler 126 retrieves the network or bus-port address of the peer from the subscription manager 138, generates a header that includes the address, and generates the message from the data/event and the header.

Although the technique for storing and retrieving data stored in the DPSRAMS 100 and 102 involves the use of pointers and data identifiers, one may modify the input- and output-data handlers 120 and 126 to implement other data-management techniques. Conventional examples of such data-management techniques include pointers using keys or tokens, input/output control (IOC) block, and spooling.

The communication shell 84 includes a physical layer that interfaces the hardwired pipelines 74$_1$-74$_n$ to the output-data queue 128, the controller 86, and the DPSRAMs 100, 102, and 104. The shell 84 includes interfaces 140 and 142, and optional interfaces 144 and 146. The interfaces 140 and 146 may be similar to the interface 136; the interface 140 reads input data from the DPSRAM 100 via the port 108, and the interface 146 reads intermediate data from the DPSRAM 104 via the port 116. The interfaces 142 and 144 may be similar to the interface 132; the interface 142 writes processed data to the DPSRAM 102 via the port 110, and the interface 144 writes intermediate data to the DPSRAM 104 via the port 114.

The controller 86 includes a sequence manager 148 and a synchronization interface 150, which receives one or more synchronization signals SYNC. A peer, such as the host processor 42 (FIG. 3), or a device (not shown) external to the peer-vector machine 40 (FIG. 3) may generate the SYNC signal, which triggers the sequence manager 148 to activate the hardwired pipelines 74$_1$-74$_n$ as discussed below and in previously cited U.S. patent application Ser. No. 10/683,932 entitled PIPELINE ACCELERATOR HAVING MULTIPLE PIPELINE UNITS AND RELATED COMPUTING MACHINE AND METHOD. The synchronization interface 150 may also generate a SYNC signal to trigger the pipeline circuit 80 or to trigger another peer. In addition, the events from the input-event queue 124 also trigger the sequence manager 148 to activate the hardwired pipelines 74$_1$-74$_n$ as discussed below.

The sequence manager 148 sequences the hardwired pipelines 74$_1$-74$_n$ through their respective operations via the communication shell 84. Typically, each pipeline 74 has at least three operating states: preprocessing, processing, and post processing. During preprocessing, the pipeline 74, e.g., initializes its registers and retrieves input data from the DPSRAM 100. During processing, the pipeline 74, e.g., operates on the retrieved data, temporarily stores intermediate data in the DPSRAM 104, retrieves the intermediate data from the DPSRAM 104, and operates on the intermediate data to generate result data. During post processing, the pipeline 74, e.g., loads the result data into the DPSRAM 102. Therefore, the sequence manager 148 monitors the operation of the pipelines $74_1$-$74_n$ and instructs each pipeline when to begin each of its operating states. And one may distribute the pipeline tasks among the operating states differently than described above. For example, the pipeline 74 may retrieve input data from the DPSRAM 100 during the processing state instead of during the preprocessing state.

Furthermore, the sequence manager 148 maintains a predetermined internal operating synchronization among the hardwired pipelines $74_1$-$74_n$. For example, to avoid all of the pipelines $74_1$-$74_n$ simultaneously retrieving data from the DPSRAM 100, it may be desired to synchronize the pipelines such that while the first pipelineu $74_1$ is in a preprocessing state, the second pipeline $74_2$ is in a processing state and the third pipeline $74_3$ is in a post-processing state. Because a state of one pipeline 74 may require a different number of clock cycles than a concurrently performed state of another pipeline, the pipelines $74_1$-$74_n$ may lose synchronization if allowed to run freely. Consequently, at certain times there may be a "bottle neck," as, for example, multiple pipelines 74 simultaneously attempt to retrieve data from the DPSRAM 100. To prevent the loss of synchronization and its undesirable consequences, the sequence manager 148 allows all of the pipelines 74 to complete a current operating state before allowing any of the pipelines to proceed to a next operating state. Therefore, the time that the sequence manager 148 allots for a current operating state is long enough to allow the slowest pipeline 74 to complete that state. Alternatively, circuitry (not shown) for maintaining a predetermined operating synchronization among the hardwired pipelines $74_1$-$74_n$ may be included within the pipelines themselves.

In addition to sequencing and internally synchronizing the hardwired pipelines $74_1$-$74_n$, the sequence manager 148 synchronizes the operation of the pipelines to the operation of other peers, such as the host processor 42 (FIG. 3), and to the operation of other external devices in response to one or more SYNC signals or to an event in the input-events queue 124.

Typically, a SYNC signal triggers a time-critical function but requires significant hardware resources; comparatively, an event typically triggers a non-time-critical function but requires significantly fewer hardware resources. As discussed in previously cited U.S. patent application Ser. No. 10/683, 932 entitled PIPELINE ACCELERATOR HAVING MULTIPLE PIPELINE UNITS AND RELATED COMPUTING MACHINE AND METHOD, because a SYNC signal is routed directly from peer to peer, it can trigger a function more quickly than an event, which must makes its way through, e.g., the pipeline bus 50 (FIG. 3), the input-data handler 120, and the input-event queue 124. But because they are separately routed, the SYNC signals require dedicated circuitry, such as routing lines, buffers, and the SYNC interface 150, of the pipeline circuit 80. Conversely, because they use the existing data-transfer infrastructure (e.g. the pipeline bus 50 and the input-data handler 120), the events require only the dedicated input-event queue 124. Consequently, designers tend to use events to trigger all but the most time-critical functions.

For some examples of function triggering and generally a more detailed description of function triggering, see application Ser. No. 10/683,929 entitled PIPELINE ACCELERATOR FOR IMPROVED COMPUTING ARCHITECTURE AND RELATED SYSTEM AND METHOD.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A sensor assembly, comprising:
 a sensor operable to sense a physical parameter and generate an electrical signal responsive to the sensed physical parameter; and
 a pipeline accelerator having local processing circuitry physically positioned proximate to the sensor and electrically coupled to the sensor, the local processing circuitry including an output port adapted to be coupled to a communications channel and operable to process a first data set from the sensor to generate a second data set and to provide the second data set to a communicatively coupled host processor via the communications channel and output port, said second data set derived from said first data set and having a size less than the first data set such that the second data set is operable to be transmitted through a low-bandwidth channel in less time than the first data set.

2. The sensor assembly of claim 1 wherein the second data set comprises a message including a header portion indicating a destination of the message and a payload portion.

3. The sensor assembly of claim 1 wherein the local processing circuitry comprises a peer vector machine.

4. The sensor assembly of claim 1 wherein the pipeline accelerator includes an input port and wherein the sensor is coupled to the input port.

5. The sensor assembly of claim 1 wherein the sensor is coupled to the local processing circuitry through the communications channel.

6. The sensor assembly of claim 1 wherein the local processing circuitry applies the second data set on the output port according to a bandwidth-enhancement communications protocol.

7. The sensor assembly of claim 6 wherein the bandwidth-enhancement communications protocol comprises one of the xDSL protocols.

8. The sensor assembly of claim 1 wherein the pipeline accelerator is formed in a field programmable gate array (FPGA).

9. The sensor assembly of claim 8 wherein the pipeline accelerator further comprises:
 a memory; and
 a hardwired-pipeline circuit coupled to the memory and operable to,
  receive the first data set from the sensor;
  load the first data set into the memory;
  retrieve the first data set from the memory;
  process the retrieved first data set to generate the second data set; and
  provide the second data set to a host processor coupled to the hardwired-pipeline circuit via the communications channel and output port.

10. The sensor assembly of claim 9 further comprising a plurality of sensors and a plurality of hardwired-pipeline circuits, each hardwired-pipeline circuit being coupled to a respective sensor.

11. A system, comprising:
a communications channel;
a host processor coupled to the communications channel; and
a sensor assembly, including,
a sensor operable to sense a physical parameter and generate an electrical signal responsive to the sensed physical parameter;
a pipeline accelerator having local processing circuitry physically positioned proximate to the sensor and electrically coupled to the sensor, the local processing circuitry including an output port adapted to be coupled to a communications channel and operable to process a first data set from the sensor to generate a second data set and to provide the second data set to a communicatively coupled host processor via the communications channel and output port, said second data set derived from said first data set and having a size less than the first data set such that the second data set is operable to be transmitted through a low-bandwidth channel in less time than the first data set.

12. The system of claim 11 wherein the second data set comprises a message including a header portion indicating a destination of the message and a payload portion.

13. The system of claim 11 wherein the local processing circuitry comprises a peer vector machine.

14. The system of claim 11 wherein the pipeline accelerator is formed in a field programmable gate array (FPGA).

15. The system of claim 11 wherein the pipeline accelerator includes an input port and wherein the sensor is coupled to the input port.

16. The system of claim 11 wherein the sensor is coupled to the local processing circuitry through the communications channel.

17. The system of claim 11 wherein the local processing circuitry communicates the second data set over the communications channel according to a bandwidth-enhancement communications protocol.

18. The system of claim 17 wherein the bandwidth-enhancement communications protocol comprises one of the xDSL protocols.

19. The system of claim 11 wherein the pipeline accelerator further comprises:
a memory; and
a hardwired-pipeline circuit coupled to the memory and operable to,
receive the first data set from the sensor;
load the first data set into the memory;
retrieve the first data set from the memory;
process the retrieved first data set to generate the second data set; and
provide the second data set to a host processor coupled to the hardwired-pipeline circuit via the communications channel and output port.

20. The system of claim 19 further comprising a plurality of sensors and a plurality of hardwired-pipeline circuits, each hardwired-pipeline circuit being coupled to a respective sensor.

21. A method of processing data from a sensor, comprising:
receiving a first data set from the sensor;
locally processing with a pipeline accelerator the received first data set physically proximate the sensor to generate a second data set, said second data set derived from said first data set and having a size less than the first data set such that the second data set is operable to be transmitted through a low-bandwidth channel in less time than the first data set; and
communicating the second data set over a low-bandwidth communications channel.

22. The method of claim 21 further comprising receiving the second data set communicated over the communications channel and making operational decisions using the received second data set.

23. The method of claim 21 wherein communicating the second data set over a communications channel comprises communicating the second data set using a bandwidth-enhancement communications protocol.

24. The method of claim 23 wherein the bandwidth-enhancement communications protocol comprises one of the xDSL protocols.

25. A sensor assembly, comprising:
a sensor operable to sense a physical parameter and generate an electrical signal responsive to the sensed physical parameter; and
a pipeline accelerator having local processing circuitry physically positioned proximate the sensor and electrically coupled to the sensor, the local processing circuitry including an output port adapted to be coupled to a degraded communications channel, the local processing circuitry operable to process a first data set from the sensor to generate a second data set and to enhance the bandwidth of said second data set, the local processing circuitry providing the bandwidth-enhanced second data set on the output port for communication over the degraded communications channel, said second data set derived from said first data set and having a size less than the first data set such that the second data set is operable to be transmitted through a low-bandwidth channel in less time than the first data set.

* * * * *

UNITED STATES PATENT AND TRADEMARK OFFICE
CERTIFICATE OF CORRECTION

| | | |
|---|---|---|
| PATENT NO. | : 7,619,541 B2 | Page 1 of 1 |
| APPLICATION NO. | : 11/243528 | |
| DATED | : November 17, 2009 | |
| INVENTOR(S) | : Schulz et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 423 days.

Signed and Sealed this

Fourteenth Day of December, 2010

David J. Kappos
*Director of the United States Patent and Trademark Office*